US 11,440,009 B2

United States Patent
Chen et al.

(12) United States Patent
Chen et al.

(10) Patent No.: US 11,440,009 B2
(45) Date of Patent: Sep. 13, 2022

(54) PLURALITY OF FILTERS

(71) Applicant: HEWLETT-PACKARD DEVELOPMENT COMPANY, L.P., Houston, TX (US)

(72) Inventors: Chien-Hua Chen, Corvallis, OR (US); Michael W. Cumbie, Corvallis, OR (US); Devin Alexander Mourey, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 380 days.

(21) Appl. No.: 16/097,460

(22) PCT Filed: Jul. 15, 2016

(86) PCT No.: PCT/US2016/042542
§ 371 (c)(1),
(2) Date: Oct. 29, 2018

(87) PCT Pub. No.: WO2018/013136
PCT Pub. Date: Jan. 18, 2018

(65) Prior Publication Data
US 2019/0143325 A1 May 16, 2019

(51) Int. Cl.
*B01L 3/00* (2006.01)
*B01D 29/03* (2006.01)
(Continued)

(52) U.S. Cl.
CPC ........ *B01L 3/502753* (2013.01); *B01D 29/01* (2013.01); *B01D 29/012* (2013.01);
(Continued)

(58) Field of Classification Search
CPC ........ B01L 3/502753; B01L 3/502707; B01L 2300/0645; B01L 2200/0631;
(Continued)

(56) References Cited

U.S. PATENT DOCUMENTS 9,089,819 B2  7/2015  Walavalkar et al.
9,149,805 B2  10/2015  Kartalov et al.
(Continued)

FOREIGN PATENT DOCUMENTS

WO   WO-1999033559         7/1999
WO   WO-2004011146 A1 *   2/2004   .......... B01F 11/0071
(Continued)

OTHER PUBLICATIONS

Yoon, Y-K.; "Integrated Vertical Screen Microfilter System Using Inclined Su-8 Structures"; Mar. 12, 2002.

*Primary Examiner* — Benjamin R Whatley
*Assistant Examiner* — Jean Caraballo-Leon
(74) *Attorney, Agent, or Firm* — Fabian VanCott

(57) ABSTRACT

A method may include etching a number of holes into a carrier wafer layer to form a plurality of filters in the carrier wafer layer, patterning a chamber layer over a first side of the carrier wafer layer to form chambers above each filter formed in the carrier wafer layer, forming a layer over the chamber layer, grinding a second side of the carrier wafer
(Continued)

layer to expose the number of holes etched into the carrier wafer layer, and bonding a molded substrate to the carrier wafer layer opposite the chamber layer.

20 Claims, 12 Drawing Sheets

(51) Int. Cl.
    *B01D 29/56*     (2006.01)
    *B01D 29/01*     (2006.01)
    *B81B 1/00*     (2006.01)
    *B81C 1/00*     (2006.01)

(52) U.S. Cl.
    CPC ............. *B01D 29/03* (2013.01); *B01D 29/56* (2013.01); *B01L 3/502707* (2013.01); *B81B 1/006* (2013.01); *B81C 1/00119* (2013.01); *B01L 2200/0631* (2013.01); *B01L 2300/0645* (2013.01); *B01L 2300/0681* (2013.01); *B01L 2300/0883* (2013.01); *B01L 2300/0887* (2013.01); *B01L 2400/0415* (2013.01); *B81B 2201/10* (2013.01); *B81B 2203/0338* (2013.01); *B81B 2203/0353* (2013.01); *B81C 2201/013* (2013.01); *B81C 2201/0125* (2013.01); *B81C 2203/03* (2013.01)

(58) Field of Classification Search
    CPC ..... B01L 2300/0883; B01L 2300/0681; B01L 2300/0887; B01L 2400/0415; B01D 29/01; B01D 29/012; B01D 29/03; B01D 29/56; B81B 1/006; B81B 2201/10; B81B 2203/0338; B81B 2203/0353; B81C 1/00119; B81C 2201/0125; B81C 2201/013; B81C 2203/03
    See application file for complete search history.

(56) References Cited

U.S. PATENT DOCUMENTS

| | | | |
|---|---|---|---|
| 2003/0175947 A1* | 9/2003 | Liu | B01F 13/0059 435/288.5 |
| 2004/0053422 A1* | 3/2004 | Chan | B01L 3/502753 436/180 |
| 2004/0053455 A1* | 3/2004 | Khan | H01L 29/40114 438/197 |
| 2007/0207592 A1* | 9/2007 | Lu | H01L 25/0657 438/455 |
| 2009/0291463 A1 | 11/2009 | Gilbert | |
| 2010/0288689 A1 | 11/2010 | Zhu et al. | |
| 2012/0018819 A1* | 1/2012 | Ferrera | B81C 1/00071 257/415 |
| 2012/0080361 A1* | 4/2012 | Walavalkar | B07B 1/4618 209/235 |
| 2012/0225559 A1* | 9/2012 | Jackson | B81C 1/00047 438/702 |
| 2012/0258475 A1 | 10/2012 | Tang | |
| 2013/0025125 A1* | 1/2013 | Petruchik | B41J 2/14 29/890.1 |
| 2013/0112612 A1 | 5/2013 | Blankenstein et al. | |
| 2013/0267005 A1* | 10/2013 | Kartalov | A61M 1/3496 435/183 |
| 2015/0041316 A1* | 2/2015 | Miki | B01L 3/502753 204/406 |

FOREIGN PATENT DOCUMENTS

| | | | |
|---|---|---|---|
| WO | WO-2008006201 A1 * | 1/2008 | .............. G01N 1/40 |
| WO | WO-2013159189 | 10/2013 | |
| WO | WO-2015002975 A1 * | 1/2015 | .............. B01L 3/561 |

\* cited by examiner

PLURALITY OF FILTERS

BACKGROUND

Infections and diseases can be detected through analysis of certain bodily fluids, such as blood, to be analyzed. These analytes may comprise certain components that, when analyzed, will lead to a diagnosis of a certain disease, bacterial infection, virus, or other ailment. Certain disposable microfluidic devices may be used to perform this analysis.

BRIEF DESCRIPTION OF THE DRAWINGS

The accompanying drawings illustrate various examples of the principles described herein and are a part of the specification. The illustrated examples are given merely for illustration, and do not limit the scope of the claims.

Throughout the drawings, identical reference numbers designate similar, but not necessarily identical, elements.

DETAILED DESCRIPTION

Figure 1:
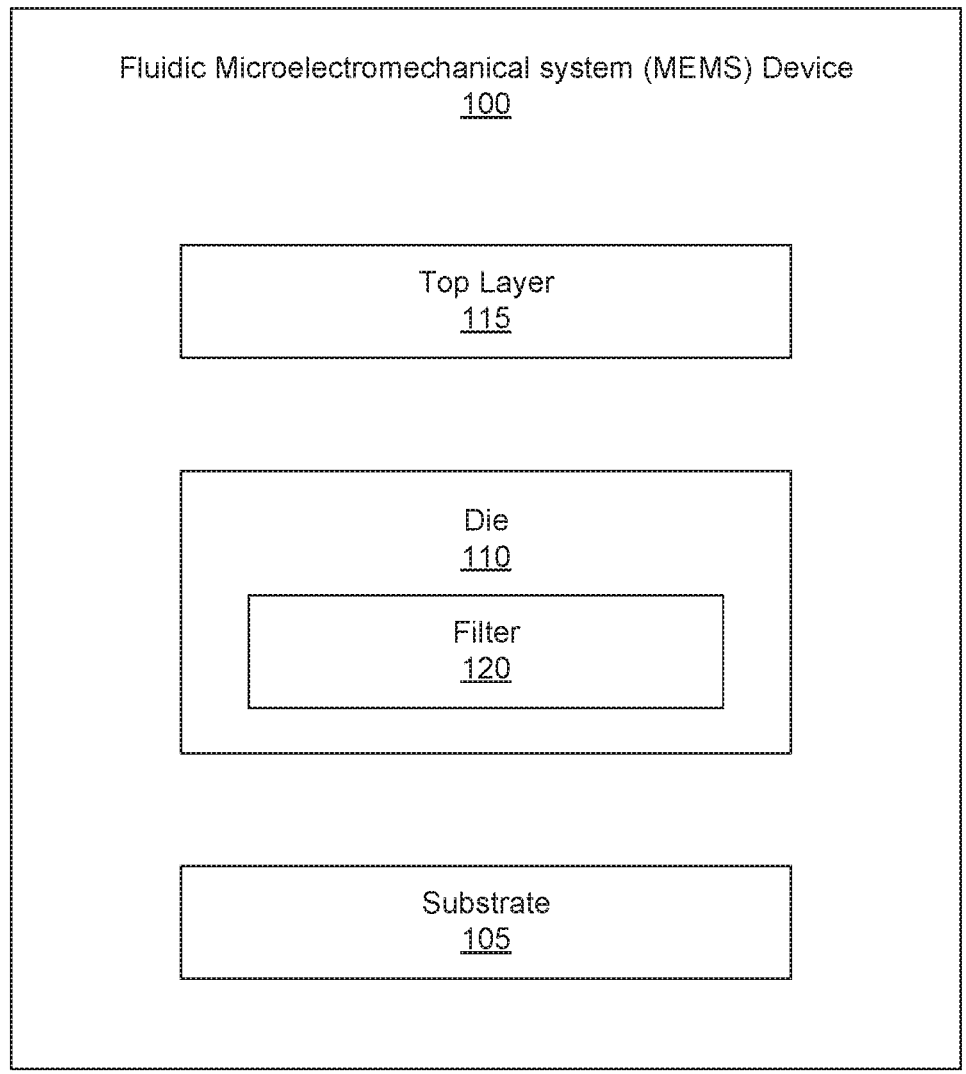
FIG. 1 is a block diagram of a fluidic microelectromechanical system (MEMS) device according to an example of the principles described herein.

As mentioned above, microfluidic devices such as a lab-on-chip (LOC) or more generally a microelectromechanical system (MEMS), may be used in the diagnosis of a patient who is suffering from a disease or infection.

As the analyte is placed into a microfluidic channel defined in the microfluidic device, a number of pumps may cause the analyte to pass through other microfluidic channels and across a number of types of sensors that detect the properties of the analyte or components of the analyte. In some cases, a sensor may analyze a specific component of the analyte. In order to do so, a filter may be provided along the fluidic path of the analyte so that a number of components within the analyte may be separated from the whole analyte.

The present specification describes a MEMS device that allows for the filtration of a plurality of components in an analyte to be filtered from the analyte and directed to other portions of the MEMS device for further analysis. A plurality of filters may be defined in a die sandwiched between a die carrier substrate and a chamber and top plate layer. The microfluidic channels created by the die's interface among the die carrier substrate and chamber/top plate layers causes the analyte to serpentine through the plurality of filters defined in the die with each filter filtering out a specific size and/or type of component in the analyte. In an example, a cross flow channel may be provided to direct a filtered out component of the analyte to another portion of the MEMS device for analysis.

The present specification, therefore, describes a method including etching a number of holes into a carrier wafer layer to form a plurality of filters in the carrier wafer layer, patterning a chamber layer over a first side of the carrier wafer layer to form chambers above each filter formed in the carrier wafer layer, forming a layer over the chamber layer, grinding a second side of the carrier wafer layer to expose the number of holes etched into the carrier wafer layer, and bonding a molded substrate to the carrier wafer layer opposite the chamber layer.

The present specification further describes a fluidic microelectromechanical system (MEMS) device including a substrate, a die bonded to the substrate, and a top layer bonded to the die opposite the substrate wherein the die comprises a plurality of filters with each filter comprising a number of holes defined through the die perpendicular to a plane formed by the substrate and wherein an interface between the substrate, die, and top layer creates a serpentine fluidic flow through the plurality of filters.

The present specification further describes a device including a plurality of filters formed vertically through a silicon layer of the device and a number of cross-flowing microfluidic channels placed between at least two of the filters wherein the plurality of filters each comprise a number of holes defined through their respective layer.

As used in the present specification and in the appended claims, the term ""analyte" is meant to be understood as any substance within a fluid that may be placed in a microfluidic diagnostic chip (MDC) to be analyzed. In one example, the analyte may be any constituent substance within a fluid such as, but not limited to, animal or human blood, animal or human urine, animal or human feces, animal or human mucus, animal or human saliva, or yeast, among others.

Further, in the present specification and in the appended claims the term "component" is meant to be understood as a constituent part of an analyte. As an example, a red blood cell would be a component of the analyte blood.

Even still further, as used in the present specification and in the appended claims, the term "a number of" or similar language is meant to be understood broadly as any positive number comprising 1 to infinity.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an example" or similar language means that a particular feature, structure, or characteristic described in connection with that example is included as described, but may not be included in other examples.

Turning now to the figures, FIG. 1 is a block diagram of a fluidic microelectromechanical system (MEMS) device (100) according to one example of the principles described herein. The fluidic MEMS device (100) may include a die (110). The die (110) may be bonded to a substrate (105). The die (110) may include a plurality of filters (120) with each filter (120) including a number of holes defined through the die (110) perpendicular to a plane formed by the substrate (105). The fluidic MEMS device (100) may further include a top layer (115) opposite the side of the die (110) where the substrate (105) is bonded. Each of these layers will be described in more detail.

The die (110) may include a silicon die with a plurality of filters (120) defined therein. Each of the filters may include any number of holes that run perpendicular to a planar surface of the die (110). In one example, each of the filters (120) may include holes that prevent or allow a certain size or shaped particle or component of an analyte to not pass or pass through the filter respectively. In this example, a first filter (120) may include holes that allow a relatively first and second sized component from passing therethrough, but not a third sized component. The first and second seized components may then be allowed to pass through the first filter and approach a second filter defined in the die (110). The second filter (120) may allow the first sized component to pass therethrough, but not the second sized component. In this way, the two filters (120) in this example allow for a fluidic MEMS device (100) that may filter from an analyte three different sized or shaped components of the analyte. This may allow for further analysis of the now relatively purer first, second, and third sized components than would otherwise be realized when the first, second, and third sized components were together in the analyte. Each of the first, second, and third sized components may then proceed throughout the fluidic MEMS device (100) as first, second, and third analytes to be analyzed by other devices defined in the fluidic MEMS device (100).

In an example, the holes defined in the die (110) may be shaped to receive a particular shaped component of the analyte while rejecting certain other shaped components. For example, a blood analyte may comprise both white and red blood cells as well as platelets. In this example, the holes may be shaped so as to receive a white blood cell while rejecting the red blood cells and platelets or visa-versa. In this way, the filter may further refine the individual components of the analyte as the analyte passes from one filter to another.

In order to allow for the analyte and its individual components to be filtered through each of the filters (120) described above, a substrate (105) and top layer (115) may each provide a second wall to contain the analyte and its relevant filtered or non-filtered components within the fluidic MEMS device (100). The substrate (105) may, in one example, be a molded plastic, a glass, a polyimide such as PYRALUX® developed by DUOPONT™ a ceramic, a stainless steel, among other materials. The molding of the substrate (105) may provide for a channel to receive an analyte or a filtered analyte from a filter (120), direct an analyte or filtered analyte to a filter (120), or both. The substrate (105) may be bonded to the die (110) via a die bond such as a die attach film, a pressure sensitive adhesive, structural adhesive dispense, a eutectic bond, among other types of die bond. In this way, the substrate (105) may act as a die carrier to hold the die (110) in position within the fluidic MEMS device (100) as well as act as a second side creating a microfluidic channel formed between the die (110) and the substrate (105).

As describe above, the top layer (115) may provide a second wall to contain the analyte and its relevant filtered or non-filtered components within the fluidic MEMS device (100). The top layer (115) may include any number of layers in order to contain the analyte or filtered analyte within the fluidic MEMS device (100). In an example, the top layer (115), may include a first layer of SU8 or photo-imageable material and a second layer of SU8 or photo-imageable material. Each of these layers of the top layer (115) may be processed to form chambers above a number of filters (120) where an analyte or filtered analyte is received from or directed to a filter. An example process of forming this fluidic MEMS device (100) will be discussed in more detail below.

As described above, the filtration of an analyte using a plurality of filters (120) allows a user of the fluidic MEMS device (100) to analyze purified specific components of the analyte. In one example, the analyte may be human blood that, using the filters (120), has all red blood cells and white blood cells filtered from the blood. The white and red blood cells may then be routed to other portions of the fluidic MEMS device (100) for further analysis using the now purer forms of the constituents. As will be described below, the formation of the filters (120) in a single die (110) allow for easier manufacture of the fluidic MEMS device (100).

Figure 2:
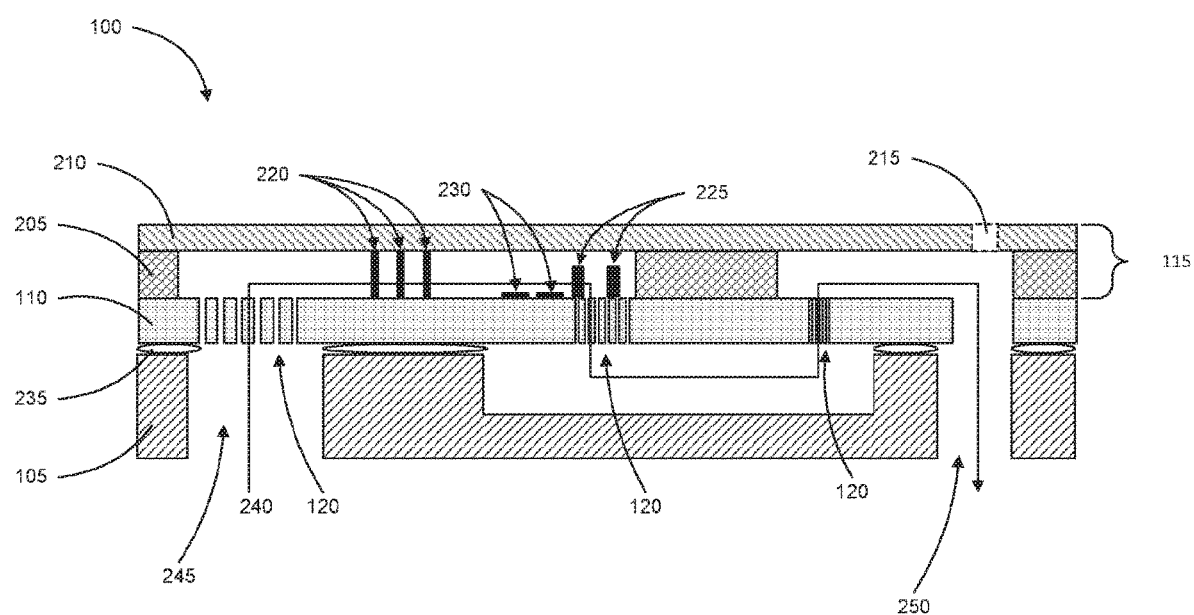
FIG. 2 is a block diagram of a side cutout view of a fluidic microelectromechanical system (MEMS) device according to an example of the principles described herein.
Figure 3:
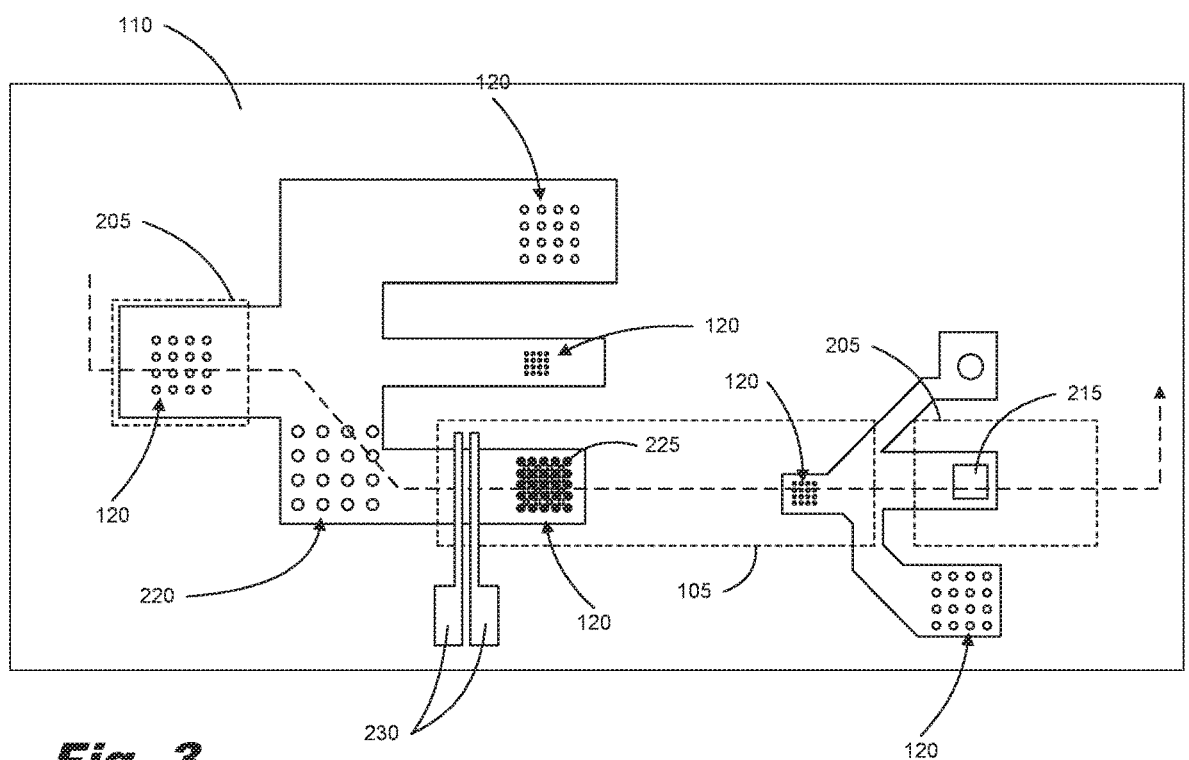
FIG. 3 is a block diagram of a top view of the fluidic microelectromechanical system (MEMS) device of FIG. 2 according to an example of the principles described herein.
Figure 4A:
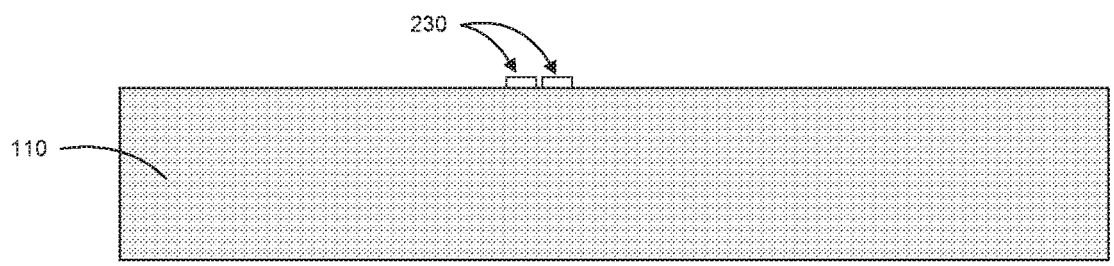
FIGS. 4A through 4G show a process of manufacturing the fluidic MEMS device of FIGS. 1-3 according to an example of the principles described herein.
Figure 4B:
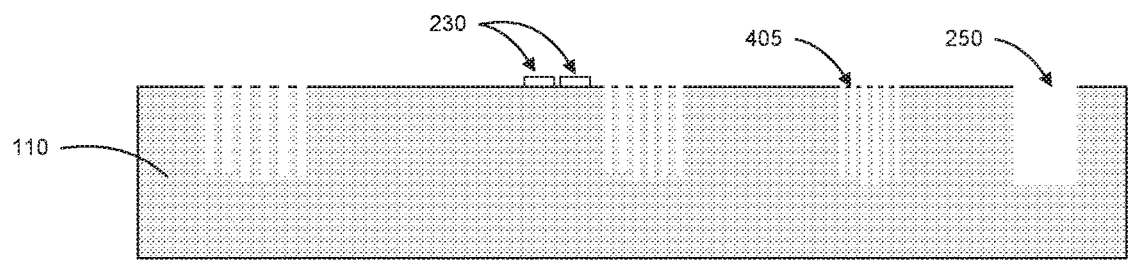
Figure 4C:
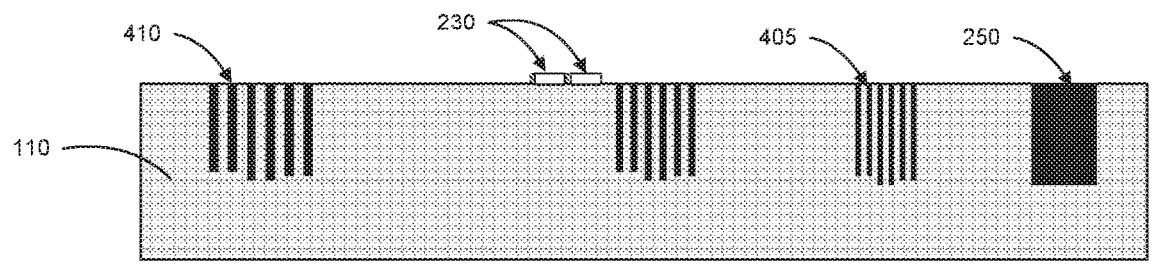
Figure 4D:
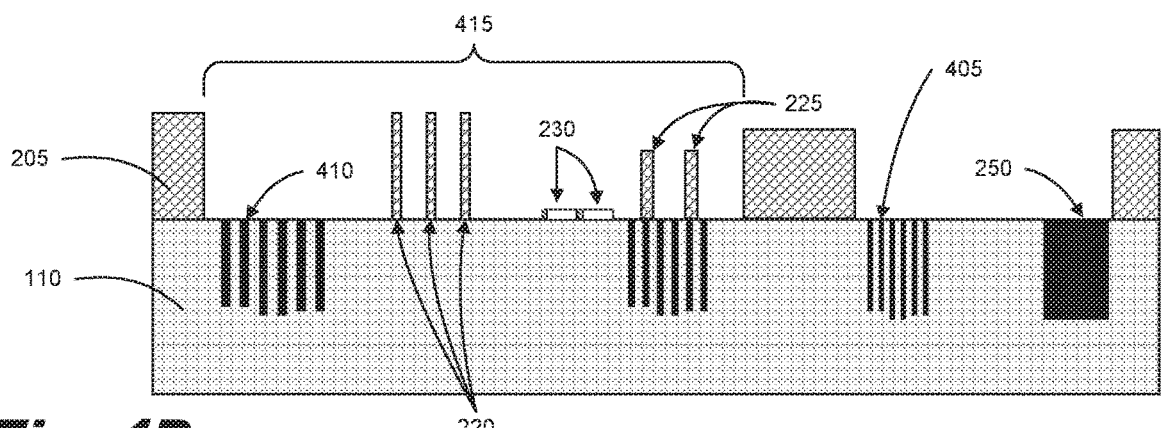
Figure 4E:
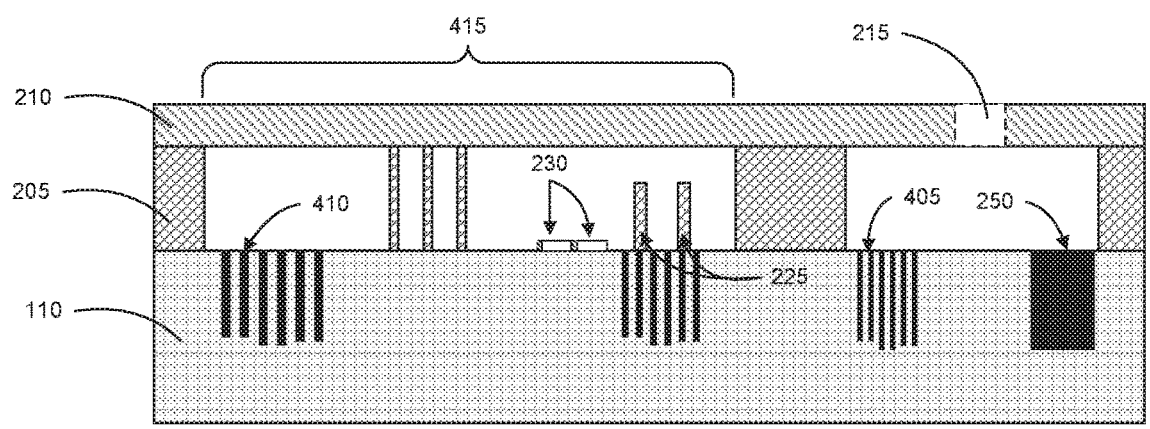
Figure 4F:
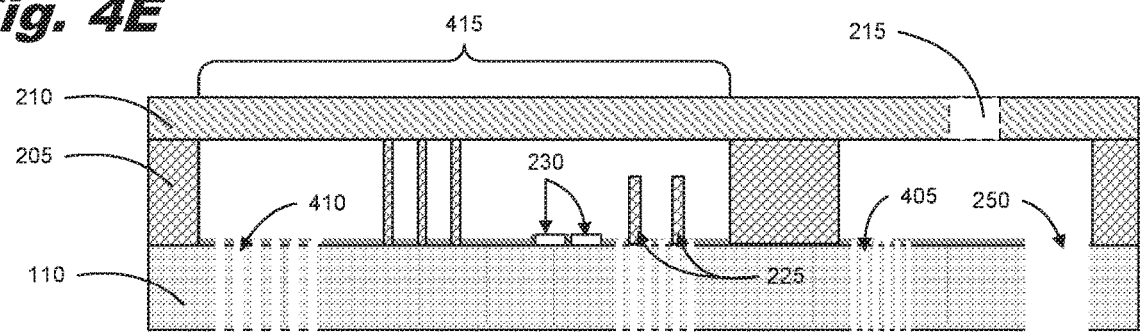
Figure 4G:
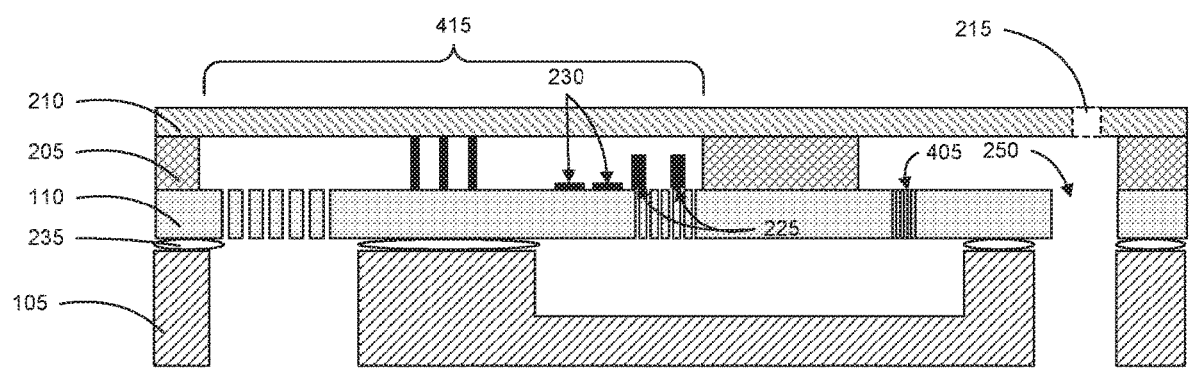

FIG. 2 is a block diagram of a side cutout view of a fluidic microelectromechanical system (MEMS) device (100) according to an example of the principles described herein. FIG. 3 is a block diagram of a top view of the fluidic microelectromechanical system (MEMS) device (100) of FIG. 2 according to an example of the principles described herein. Similar to FIG. 1, the fluidic MEMS device (100) of FIGS. 2 and 3 may include a top layer (115), a die (110) having a plurality of filters (120), and a substrate (105). The fluidic MEMS device (100) may further include a number of horizontal filters (220), a number of stand-off features (225), a bore hole (215), and a number of electrodes (230). These will now be described in more detail.

As described above, the fluidic MEMS device (100) includes a die (110) bonded to a substrate (105). A die bond (235) as described above, may be used to bond the two layers together preventing the analyte that is to flow through the fluidic MEMS device (100) from leaking out of the fluidic MEMS device (100) during filtration or other analytical processes being carried out during use.

The top layer (115) may include a plurality of layers. In the example shown in FIG. 2, the top layer (115) may include a chamber layer (205), and a top plate (210). In this example, the chamber layer (205) may be formed using, for example, an epoxy-based negative photoresist such as SU-8. The features defined on the chamber layer (205) may be formed using a photolithography process. Specifically, the features defined on the chamber layer (205) may define specific chambers or microfluidic channels that the analyte flows down or through. Additionally, a number of horizontal filters (220) may be defined in the chamber layer (205). These filters may prevent certain sized components of the analyte from passing towards a filter downstream of the horizontal filters (220). These horizontal filters (220) may further direct, via crossflows in the created microfluidic channels, an analyte or a filtered analyte to another filter defined in the die (110). Further, a number of stand-off features (225) may be defined in the chamber layer (205) above any of the filters (120) to prevent the holes defining the filters (120) from being clogged during filtration. As relatively larger components of the analyte are filtered from the analyte as a whole, these may plug up the holes of the filters (120) preventing the components to be filtered out from passing through the filters (120) and stop the filtration process and flow of analyte throughout the fluidic MEMS device (100). To avoid this, the stand-off features (225) may be formed such that relatively larger components of the analyte are blocked but that relatively smaller components of the analyte pass through the filter. Example stand-off features (225) will be described in more detail below.

A number of electrodes (230) may also be defined throughout the fluidic MEMS device (100). In some examples, the number of electrodes (230) may be passivated for capacitive sense in order to measure the conductance of the analyte or components of the analyte. Additionally, electrodes (230) may be formed on the any surface within the fluidic MEMS device (100) to pump the analyte or components of the analyte through the fluidic MEMS device (100).

The fluidic MEMS device (100) may further include a top plate (210) formed on top of the chamber layer (205) to provide a second wall parallel to the die (110) to contain the analyte or components of the analyte in the fluidic MEMS device (100). The top plate (210) may be made of an epoxy-based negative photoresist such as SU-8. The features defined on the top plate (210) may be formed using a photolithography process. These features may include a bore hole (215) that interacts with atmosphere or used to house a thermal inkjet capillary pump. The top plate (210) may further include any number of electrodes (230) as with the chamber layer (205) to serve as pumps to move the analyte through the fluidic MEMS device (100) or sensors to sense the conductance of the analyte or component of the analyte.

During operation, the analyte and each of its components may flow through the fluidic MEMS device (100) as indicated by the arrow (240). The analyte may enter a first filter defined in the die (110) at an inlet (245). The analyte or components of the analyte may then pass through a plurality of filters (120) defined in the die (110) generally in a serpentine fashion along the die (110). The top layer (115) and substrate (105) provide for the containment of the analyte as it passes through each filter (120). As the analyte passes through each of the filters (120), a component of the analyte may be filtered out leaving remaining components of the analyte to proceed through the fluidic MEMS device (100). A final component or components of the analyte may pass out of the filtration system described herein via an outlet (250).

Although, FIGS. 2 and 3 show specific configurations of a fluidic MEMS device (100) having a plurality of filters (120) defined in the die (110), these figures are only meant to be examples. Different configurations may be realized and contemplated by the present specification.

FIGS. 4A through 4G show a process of manufacturing the fluidic MEMS device (100) of FIGS. 1-3 according to an example of the principles described herein. In one example, the process may begin with forming a number of number of electrodes (230) onto a die substrate such as a silicon die (110). Each of the number of electrodes (230) may perform differing functions as described above such as analyzing the analyte and/or pumping the analyte through the fluidic MEMS device (100).

In an example, the process may begin with etching a number of holes (405) into the die (110). The etched holes (405) may be about 100 um deep into the die (110). The etching process may be completed by using a wet etch process, an ultrasonic process, a deep reactive-ion etching (DRIE) process, or combinations thereof. As will be described later, this is done in order to, at least, form a plurality of filters (120) in the die (110) in a separate stage in the process. In the example shown in FIG. 4B, the holes (405) etched into the die (110) do not pass entirely through the die (110). This may be done so as to shave or otherwise remove a portion of the underside of the die (110) at a later stage in the process. In an example, an outlet (250) and/or inlet (245) may also be formed in the die (110) using the etching process.

In an example, the process may continue with filing the etched holes (405) with protective material (410) such as HT10.10 developed by WAFERBOND® developed by Brewer Science, Inc. or a wax. The protective material (410) may be planarized to be made even with the upper surface of the die (110).

In an example, the process may continue with patterning a chamber layer (205) as part of a top layer (115) over a first side of the die (110) to form chambers (415) above each of the holes (405) formed in the die (110). During this stage, a number of horizontal filters (220) and stand-off features (225) may be formed as described above. As mentioned above, the chamber layer (205) may be made of an epoxy-based negative photoresist such as SU-8 using a photolithography process.

In an example, the formation of the top layer (115) may further include forming a top plate (210) over the chamber layer (205). As described above, the top plate (210) may be made of an epoxy-based negative photoresist such as SU-8 using a photolithography process. In an example, the formation of the top plate (210) may include forming the bore hole (215) described above into the top plate (210).

The process may continue with grinding a bottom side of the die (110) to expose the number of holes (405) etched into the die (110). In an example, the die (110) may be ground to a thickness of about 100 um thin. In this example, the die (110) was about 700 um thick at the beginning of the process. In an example, the die (110) may be ground down until each of the holes (405) and bore hole (215) are exposed through the die (110).

The process may continue with bonding a substrate (105) to the die (110) opposite the chamber layer (205). As described above, the substrate (105) may be bonded to the die (110) via a die bond such as a die attach film, a pressure sensitive adhesive, structural adhesive dispense, a eutectic bond, among other types of die bond.

Figure 5:
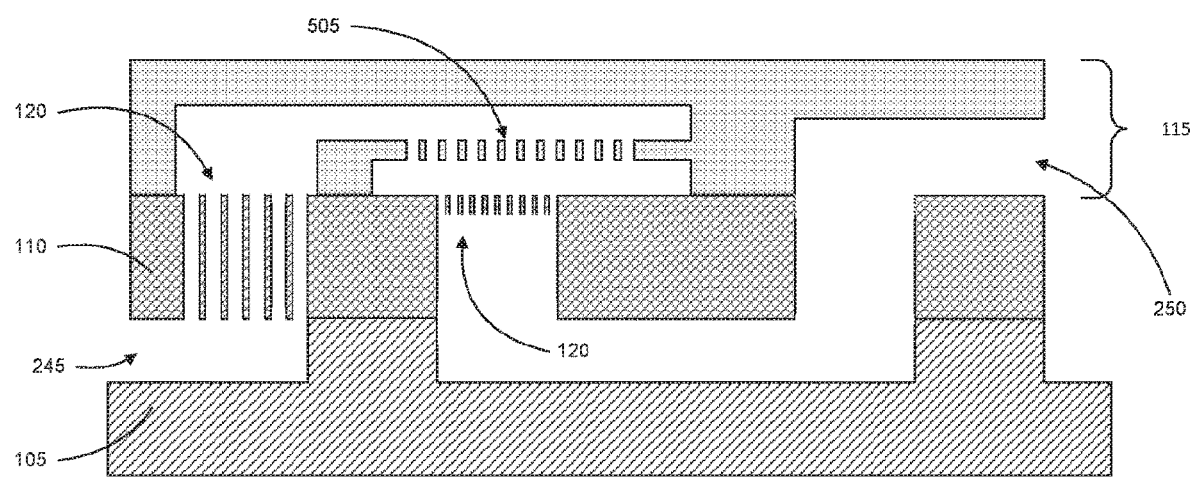
FIG. 5 is a block diagram of a side cutout view of a fluidic microelectromechanical system (MEMS) device according to an example of the principles described herein.

FIG. 5 is a block diagram of a side cutout view of a fluidic microelectromechanical system (MEMS) device (500) according to an example of the principles described herein. In the example shown in FIG. 5, the fluidic MEMS device (500) may comprise two filters (120) defined in the die (110) with an intermediate top layer filter (505) defined in the top layer (115). In this example, the top layer filter (505) may be stacked above the second of the filters (120) defined in the die (110). The top layer filter (505) may be defined in the top layer (115) using a photolithography process described above.

Figure 6:
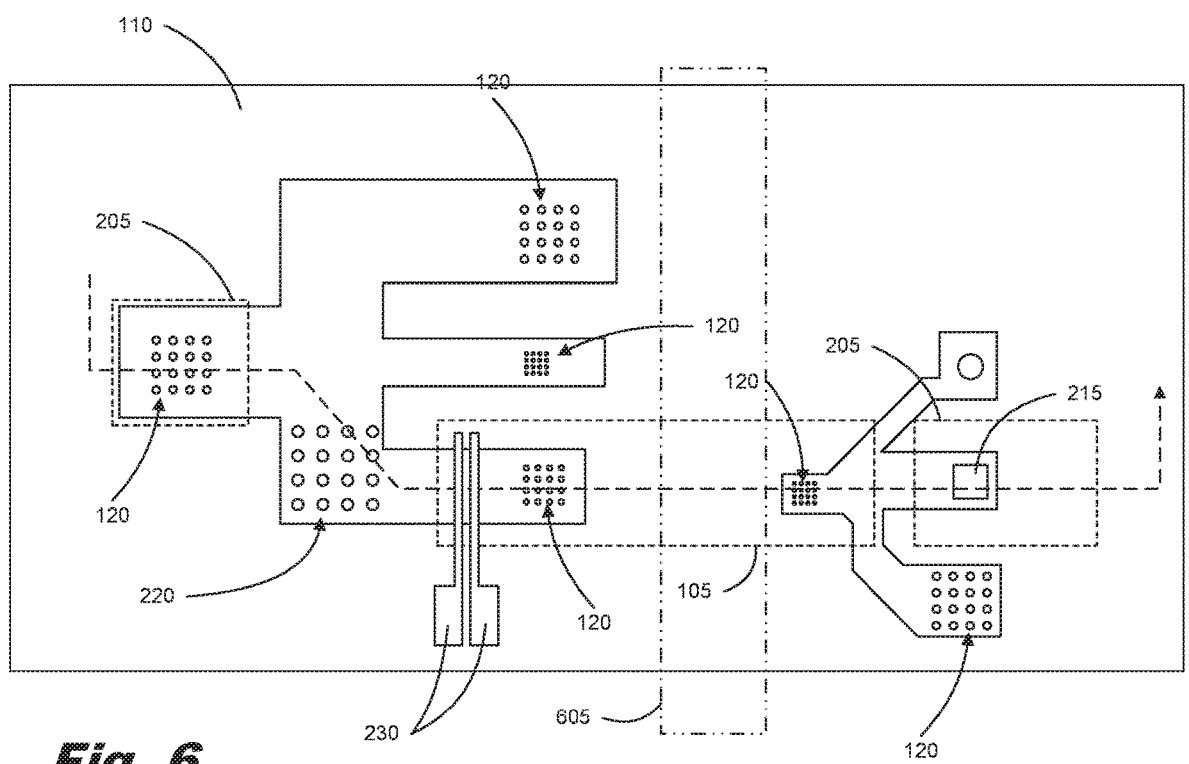
FIG. 6 is a block diagram of a top view of the fluidic microelectromechanical system (MEMS) device (600) according to an example of the principles described herein.

FIG. 6 is a block diagram of a top view of the fluidic microelectromechanical system (MEMS) device (600) according to an example of the principles described herein. Similar to the fluidic MEMS device (100) of FIGS. 1, 2, and 3, the fluidic MEMS device (600) of FIG. 6 may include a top layer (115), a die (110) having a plurality of filters (120), and a substrate (105). The fluidic MEMS device (100) may further include a number of horizontal filters (220), a number of stand-off features (225), a bore hole (215), and a number of electrodes (230).

Additionally, the fluidic MEMS device (600) may further include a crossflow microfluidic channel (605) defined between at least two filters (120) of the fluidic MEMS device (600). The crossflow microfluidic channel (605) may cause an inert fluid to draw a component of the analyte away from the filters of the fluidic MEMS device (600) and to another portion of the fluidic MEMS device (600) for analysis.

Figure 7:
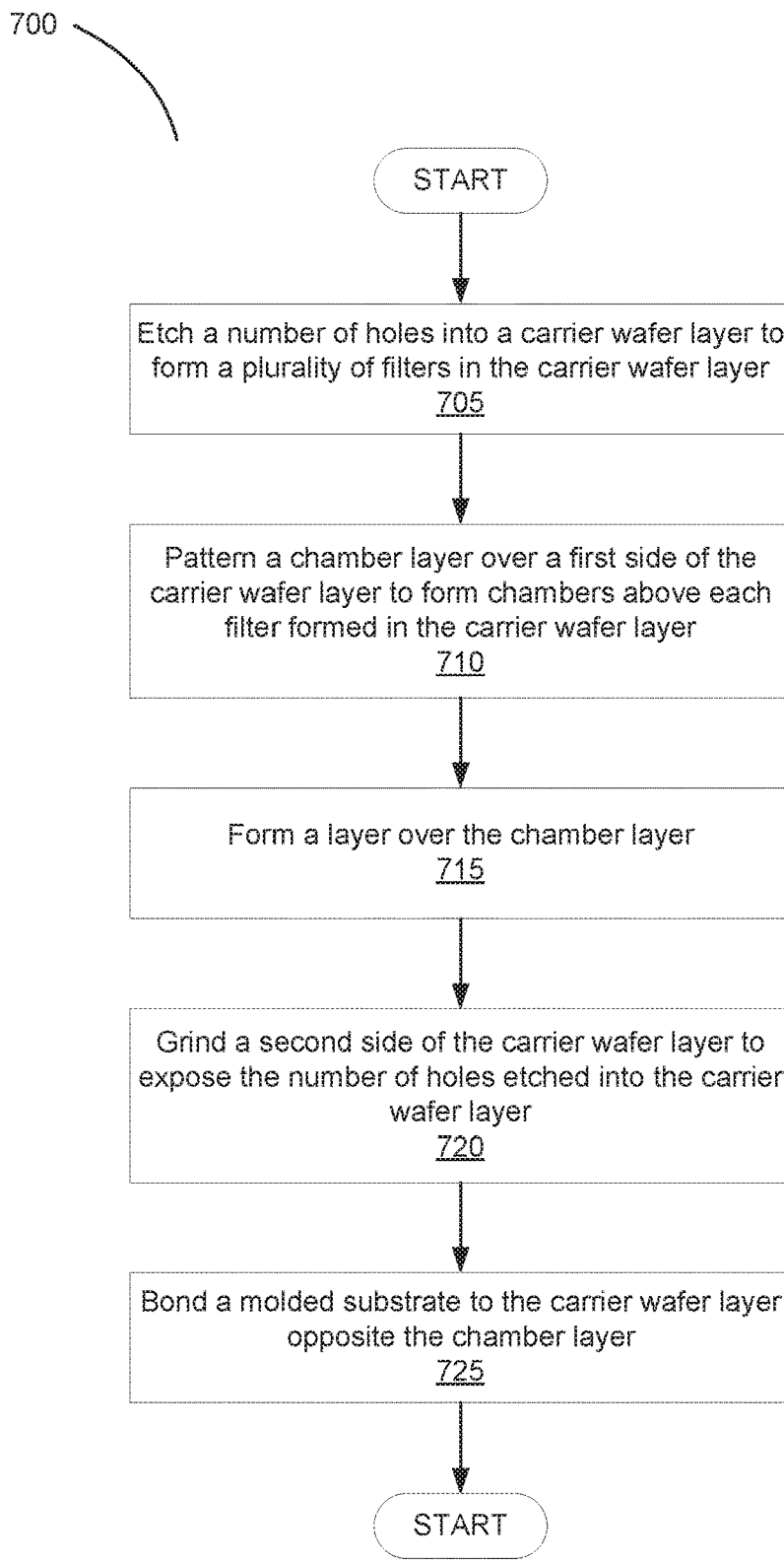
FIG. 7 is a flowchart showing a method of manufacture according to an example of the principles described herein.

FIG. 7 is a flowchart showing a method (700) of manufacturing a fluidic MEMS device according to an example of the principles described herein. The method (700) may begin with etching (705) a number of holes into a carrier wafer layer such as the die (FIG. 1, 110) to form a plurality of filters (FIG. 1, 120) in the carrier wafer layer. The etching process may be completed by using a wet etch process, an ultrasonic process, a deep reactive-ion etching (DRIE) process, or combinations thereof. This etching (705) is done in order to, at least, form a plurality of filters (FIG. 1, 120) in the die (FIG. 1, 110) in a separate stage in the process. In the example shown in FIG. 4B, the holes (FIG. 4, 405) etched into the die (FIG. 1, 110) do not pass entirely through the die (FIG. 1, 110). This may be done so as to shave or otherwise remove a portion of the underside of the die (FIG. 1, 110) at a later stage in the process. In an example, an outlet (FIG. 2, 250) and/or inlet (FIG. 2, 245) may also be formed in the die (FIG. 1, 110) using the etching process.

The method (700) may continue with patterning (710) a chamber layer over a first side of the carrier wafer layer to form chambers (FIG. 4D, 415) above each filter (FIG. 4B, 410) formed in the carrier wafer layer. As described above, a number of horizontal filters (220) and stand-off features (225) may also be formed as described above. The chamber layer (FIG. 2, 205) may be made of an epoxy-based negative photoresist such as SU-8 using a photolithography process.

The method (700) may continue with forming (715) a layer over the chamber layer. The layer formed (715) over the may be a top plate (FIG. 2, 210) made of, for example, SU-8. During this process, a bore hole (FIG. 2, 215) that interacts with atmosphere or used to house a thermal inkjet capillary pump may be formed.

The method (700) may continue with grinding (720) a second side of the carrier wafer layer to expose the number of holes etched into the carrier wafer layer. As described above, the grinding may be done until the holes are exposed resulting in the filters being formed through the carrier wafer layer. In an example, the thickness of the carrier wafer layer may be reduced to about 100 um. In an example, the thickness of the carrier wafer layer is between 50 and 150 um after grinding (720).

The method may continue with bonding (725) a molded substrate (FIG. 1, 105) to the carrier wafer layer opposite the chamber layer. The substrate (FIG. 1, 105) may be bonded to the carrier wafer layer via a carrier wafer layer bond such as a die attach film, a pressure sensitive adhesive, structural adhesive dispense, a eutectic bond, among other types of bonds. In this way, the substrate (FIG. 1, 105) may act as a carrier to hold the carrier wafer layer in position within the fluidic MEMS device (100) as well as act as a second side creating a microfluidic channel formed between the carrier wafer layer and the substrate (FIG. 1, 105).

Figure 8A:
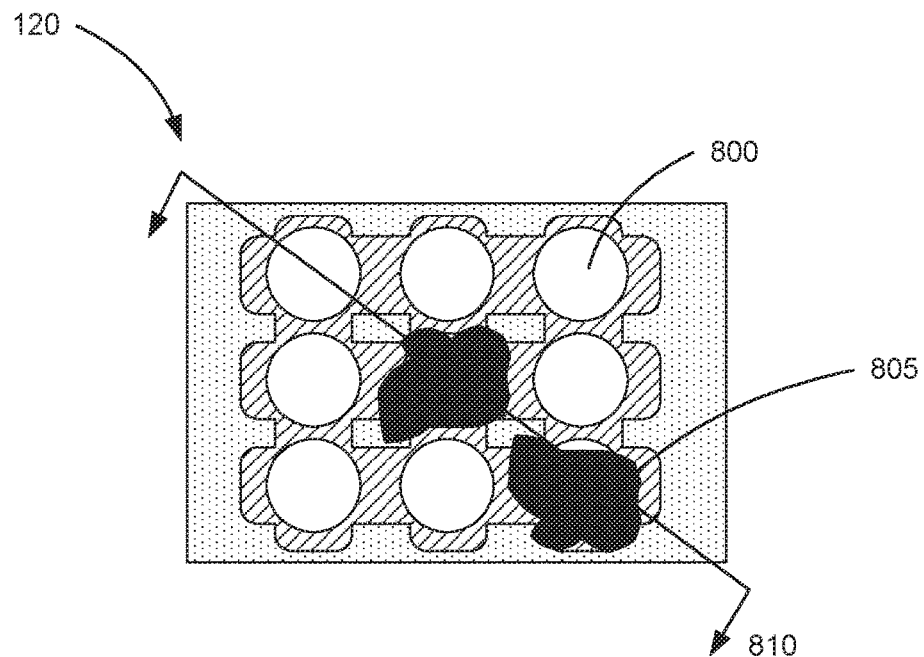
FIGS. 8A and 8B are a top and side cut-out views of stand-off features respectively according to one example of the principles described herein.
Figure 8B:
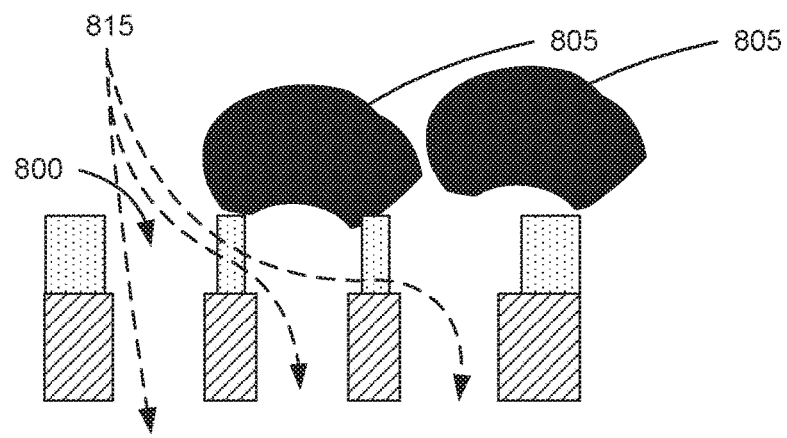

As described above, at least one of the filters (FIG. 1, 120) may include a number of stand-off features (FIG. 2, 225) defined upstream of the at least one filter (FIG. 1, 120). The stand-off features (FIG. 2, 225) prevent the holes defining the filters (FIG. 1, 120) from being dogged during filtration. FIGS. 8A and 8B are a top and side cut-out view of stand-off features respectively according to one example of the principles described herein. As described above, each of the filters (FIG. 1, 120) comprises a number of holes (800) defined in a layer of the fluidic MEMS device (FIG. 1, 100). Above these holes (800) is positioned, in one example, a number of stand-off features (FIG. 2, 225) that allow a relatively smaller component of an analyte to pass through the filter (FIG. 1, 120) while preventing the dogging of the filter (FIG. 1, 120) with relatively larger components of the analyte. FIGS. 8A and 8B show one example of the stand-off features (FIG. 2, 225) with a relatively larger component (805) of the analyte above it. A line (810) has been drawn across FIG. 8A to show where along FIG. 8A has been cut and represented in FIG. 8B. As can be seen in FIG. 8A, the number of stand-off features (FIG. 2, 225) are in the form of a lattice structure where the smaller components of the analyte may pass between sections of the lattice structure and into the holes (800) as indicated by the dashed flow line (815). Although, FIGS. 8A and 8B show a lattice-type structure for the stand-off features (FIG. 2, 225), any other shaped devices that prevent the holes (800) from being block may be used and the present specification contemplates those alternative shaped stand-off features (FIG. 2, 225).

Figure 9:
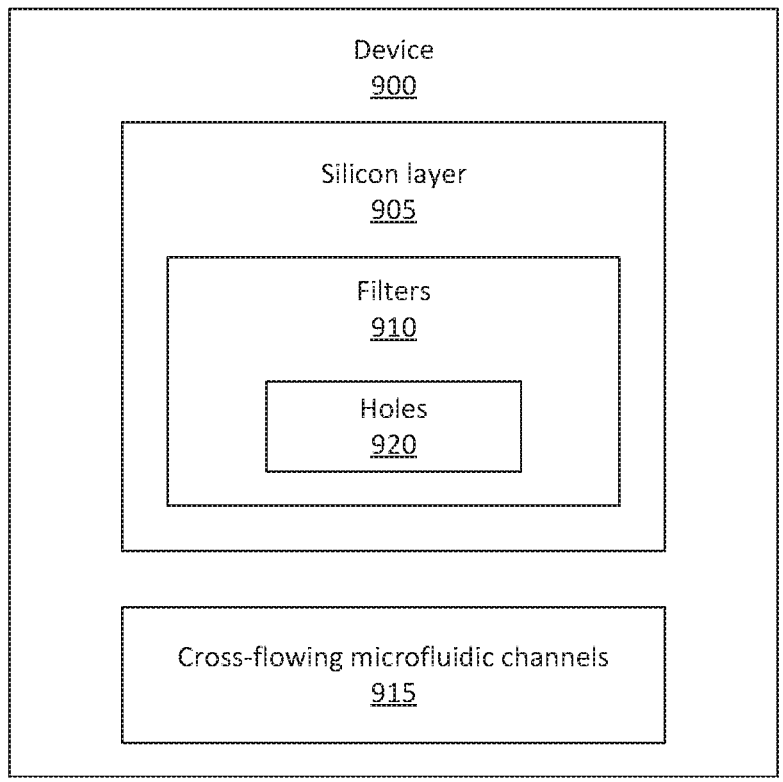
FIG. 9 is a block diagram of a device according to an example of the principles described herein.

FIG. 9 is a block diagram of a device (900) according to an example of the principles described herein. The device (900) may include a plurality of filters (910) formed vertically through a silicon layer (905) of the device (900) and a number of cross-flowing microfluidic channels placed between at least two of the filters (910). In this example, each of the filters may comprise a number of holes (920) defined therein each to filter out a different component of the analyte.

The specification and figures describe a plurality of filters in a die. The filters allow an analyte to be passed through a fluidic MEMS device of which the die is a component and filter out any number of components of the analyte. The analyte is caused to flow through the fluidic MEMS device in a serpentine fashion. Because the plurality of filters is formed in a single layer of silicon, for example, the manufacturing costs and time of the fluidic MEMS device may be reduced. Additionally, different components of the analyte may be purified from the whole analyte via the filtration and be sent to other parts of the fluidic MEMS device via a number of cross-flow channels to be analyzed. This allows for multiple analysis to be conducted at one time on multiple components of an analyte. Because the filters are defined in a single piece of silicon, the holes defining the filters can be defined using a photolithography process to achieve relatively tight control of the holes' diameters. Additionally, arbitrary shapes may be formed that filter out different-shaped component of the analyte.

The preceding description has been presented to illustrate and describe examples of the principles described. This description is not intended to be exhaustive or to limit these principles to any precise form disclosed. Many modifications and variations are possible in light of the above teaching.

What is claimed is:
1. A fluidic microelectromechanical system (MEMS) device, comprising:
  a substrate;
  a die bonded to the substrate; and
  a top layer bonded to the die opposite the substrate, wherein the top layer and the substrate each comprise a wall to form a chamber to retain an analyte between the top layer and substrate within the MEMS device;
  a number of measurement electrodes disposed within the chamber;
  a number of stand-off features disposed within the chamber, wherein the number of stand-off features:
    are not a full height of the chamber; and
    form a lattice structure wherein smaller components of an analyte pass between sections of the lattice structure; and
  a crossflow microfluidic channel comprising a flowing inert fluid, wherein the crossflow microfluidic channel is perpendicular to the chamber to draw, via crossflows, the analyte away from the chamber;

wherein the die comprises a plurality of filters with each filter comprising a number of holes defined through the die perpendicular to a plane formed by the substrate; and wherein an interface between the substrate, die, and top layer creates a serpentine fluidic flow through the plurality of filters.

2. The fluidic MEMS device of claim 1, further comprising a second filter defined in an intermediate top layer above the die, the second filter being stacked above a filter in the die.

3. The fluidic MEMS device of claim 1, wherein the stand-off features are disposed above a filter in the die.

4. The fluidic MEMS device of claim 3, wherein a spacing between the number of standoff stand-off features is greater than a spacing between the number of holes of the filter.

5. The fluidic MEMS device of claim 1, wherein the plurality of filters comprises a first filter and a second filter.

6. The fluidic MEMS device of claim 5, wherein the second filter is downstream of the first filter.

7. The fluidic MEMS device of claim 6, wherein the first filter filters out from the analyte introduced into the MEMS device a first sized component of the analyte and wherein the second filter filters out from the analyte a second sized component of the analyte.

8. The fluidic MEMS device of claim 4, wherein the crossflow microfluidic channel perpendicular to the chamber is between the first and second filters to cause the second sized component of the analyte to be drawn away from the plurality of filters through the fluidic MEMS device to another portion of the fluidic MEMs device for further processing.

9. The fluidic MEMS device of claim 6, further comprising a number of horizontal filters defined in a chamber between the first and second filters to prevent a first sized component of the analyte from contacting the second filter.

10. The fluidic MEMS device of claim 9, wherein the analyte is passed through a bottom surface of the first filter, a top surface of the second filter, and a bottom surface of the third filter.

11. A method, comprising:
etching a number of holes into a carrier wafer layer to form a plurality of filters in the carrier wafer layer;
patterning a chamber layer over a first side of the carrier wafer layer to form chambers above each filter formed in the carrier wafer layer;
forming a top layer over the chamber layer;
forming a number of stand-off features within the chamber, wherein the number of stand-off features:
are not a full height of the chamber; and
form a lattice structure wherein smaller components of an analyte pass between sections of the lattice structure;
forming an intermediate top layer filter within a chamber and defined in the top layer;
grinding a second side of the carrier wafer layer to expose the number of holes etched into the carrier wafer layer;
bonding a molded substrate to the carrier wafer layer opposite the chamber layer; and
forming a crossflow microfluidic channel comprising a flowing inert fluid, wherein the crossflow microfluidic channel is perpendicular to the chamber to draw, via crossflows, the analyte away from the chamber.

12. The method of claim 11, further comprising filling etched holes with a protective material.

13. The method of claim 11, further comprising etching a first and a second filters into the carrier wafer layer.

14. The method of claim 11, wherein grinding the carrier wafer layer comprises grinding the carrier wafer layer to a thickness of 50 μm to 150 μm.

15. The method of claim 11, wherein etching the carrier wafer layer further comprises forming an electrode between two of the filters, and wherein the electrode is a pump electrode to pump the analyte through the filters.

16. The method of claim 11, wherein the crossflow microfluidic channel is formed between two of the formed filters in the carrier wafer layer.

17. A device, comprising:
a plurality of filters formed vertically through a silicon layer of the device, wherein the plurality of filters have different vertical heights;
a number of cross-flowing microfluidic channels placed between at least two of the filters, wherein:
filters in a first cross-flowing microfluidic channel have a first spacing and filters in a second cross-flowing microfluidic channel have a second spacing;
a top layer bonded to the silicon layer and a substrate bonded to the silicon layer each comprise walls to form a chamber retain an analyte between the top layer and substrate within the device;
a number of stand-off features disposed within the chamber, wherein the number of stand-off features:
are not a full height of the chamber; and
form a lattice structure wherein smaller components of the analyte pass between sections of the lattice structure;
an inert fluid within a perpendicular crossflow microfluidic channel to draw, via crossflows, the analyte away from the chamber;
a number of horizontal filters formed on the silicon layer to direct, via crossflows, the analyte to another filter;
a number of electrodes, acting as pumps, formed on the silicon layer of the device within the microfluidic channels;
wherein the plurality of filters each comprise a number of holes defined through their respective layer.

18. The device of claim 17, wherein:
the number of horizontal filters are upstream of the number of electrodes; and
the number of stand-off features are formed on the silicon layer of the device within the microfluidic channels and downstream of the number of electrodes.

19. The device of claim 17, wherein the number of holes of the plurality of filters comprise a filter hole standoff layer to enable first sized components of the analyte to flow through the filter while preventing second sized components of the analyte from obstructing the flow of the first sized components through the filter.

20. The device of claim 19, wherein each of the plurality of filters sequentially filter out of the analyte relatively smaller components of the analyte as the analyte passes through the plurality of filters.

* * * * *